(12) United States Patent
Sato et al.

(10) Patent No.: US 8,717,715 B1
(45) Date of Patent: May 6, 2014

(54) SPIN ACCUMULATION MAGNETIC READ SENSOR

(71) Applicant: HGST Netherlands B.V., Amsterdam (NL)

(72) Inventors: Daisuke Sato, Hitachi (JP); Masaki Yamada, Kokubunji (JP)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 13/714,226

(22) Filed: Dec. 13, 2012

(51) Int. Cl.
*G11B 5/39* (2006.01)

(52) U.S. Cl.
USPC .................. 360/324; 360/324.1; 360/324.2

(58) Field of Classification Search
USPC ......... 360/324, 324.1, 324.11, 324.12, 324.2; 438/3
See application file for complete search history.

(56) References Cited

U.S. PATENT DOCUMENTS

| | | | |
|---|---|---|---|
| 6,480,365 B1 * | 11/2002 | Gill et al. | 360/324.11 |
| 7,087,324 B2 | 8/2006 | Hong et al. | |
| 8,004,029 B2 | 8/2011 | Saito et al. | |
| 8,072,713 B2 | 12/2011 | Yamada et al. | |
| 8,320,080 B1 * | 11/2012 | Braganca et al. | 360/128 |
| 2006/0044703 A1 * | 3/2006 | Inomata et al. | 360/324.1 |
| 2007/0159734 A1 * | 7/2007 | Nguyen et al. | 360/324.1 |
| 2007/0253121 A1 | 11/2007 | Yamada et al. | |
| 2009/0154030 A1 | 6/2009 | Yamada et al. | |
| 2009/0298200 A1 * | 12/2009 | Guo et al. | 438/3 |
| 2010/0119875 A1 | 5/2010 | Sasaki | |
| 2011/0042648 A1 | 2/2011 | Koo et al. | |

FOREIGN PATENT DOCUMENTS

JP 2010/127695 A 6/2010

OTHER PUBLICATIONS

Kanai et al., "Advanced Spin-Valve GMR Head," Dec. 2001, Journal of Fujitsu Science Technology, vol. 37, No. 2, pp. 174-182.

* cited by examiner

*Primary Examiner* — Jefferson Evans
(74) *Attorney, Agent, or Firm* — Zilka-Kotab, PC (57) ABSTRACT

A spin accumulation magnetic sensor having improved signal strength and efficiency. The spin accumulation magnetic sensor has a detector structure and a spin injection structure and has a non-magnetic, electrically conductive layer extending between the spin injection structure and the detector structure. The detector structure has first and second free layers arranged such that the non-magnetic, electrically conductive layer extends between them and so that they are magnetically anti-parallel coupled with one another. The spin injection structure can also include first and second magnetic layers with the electrically conductive layer extending between them and with the first magnetic layer being pinned and the second magnetic layer being anti-parallel coupled with the first magnetic layer.

18 Claims, 8 Drawing Sheets

SPIN ACCUMULATION MAGNETIC READ SENSOR

FIELD OF THE INVENTION

The present invention relates to magnetic data recording and more particularly to a spin accumulation sensor for detecting a magnetic signal in a magnetic data recording device.

BACKGROUND OF THE INVENTION

At the heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating, but when the disk rotates air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes at least one coil, a write pole and one or more return poles. When a current flows through the coil, a resulting magnetic field causes a magnetic flux to flow through the write pole, which results in a magnetic write field emitting from the tip of the write pole. This magnetic field is sufficiently strong that it locally magnetizes a portion of the adjacent magnetic disk, thereby recording a bit of data. The write field, then, travels through a magnetically soft underlayer of the magnetic medium to return to the return pole of the write head.

A magnetoresistive sensor such as a Giant Magnetoresistive (GMR) sensor or a Tunnel Junction Magnetoresisive (TMR) sensor has traditionally been employed to read a magnetic signal from the magnetic media. The magnetoresistive sensor has an electrical resistance that changes in response to an external magnetic field. This change in electrical resistance can be detected by processing circuitry in order to read magnetic data from the adjacent magnetic media.

The ever increasing need for increased data storage necessitates ever increasing data density in magnetic data storage devices. One way to increase data density is to decrease the size and spacing of magnetic bits recorded on the media. As the sensor is generally sandwiched between a pair of magnetic shields, the spacing between which determines the bit length, also referred to as gap thickness. Sensors such as GMR or TMR sensors are constructed as a stack of layers all formed upon one another sandwiched between the magnetic shields. Accordingly, the ability to reduce the spacing between shields with such as sensor structure is limited. There remains, therefore, a need for a sensor design that can significantly reduce gap thickness (i.e. bit length) while still providing a strong signal with low signal noise.

SUMMARY OF THE INVENTION

The present invention provides a magnetic sensor that includes a detector structure located near an air bearing surface, the detector structure including first and second magnetic free layers that are magnetically anti-parallel coupled with one another and also including a spin injection structure located away from the air bearing surface. A non-magnetic, electrically conductive layer extends from the detector structure to the spin injection structure, and passes between the first and second magnetic free layer structures.

In addition, the spin injection structure may include first and second magnetic layers with the first magnetic layer being pinned and the second magnetic layer being anti-parallel coupled with the first magnetic layer.

A current source can be connected with the spin injection structure between the first and second magnetic layers, and a voltage detector can be connected with the detector structure between the first and second magnetic free layers. In addition, a second current source can be connected with the detector structure in series with the voltage detector.

The sensor structure provides a spin accumulation sensor with greatly improved performance. Providing the sensor with a second magnetic free layer and even with a second magnetic layer in the spin injection structure greatly improves sensor output and avoids the loss of spin current in the sensor.

These and other features and advantages of the invention will be apparent upon reading of the following detailed description of preferred embodiments taken in conjunction with the figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
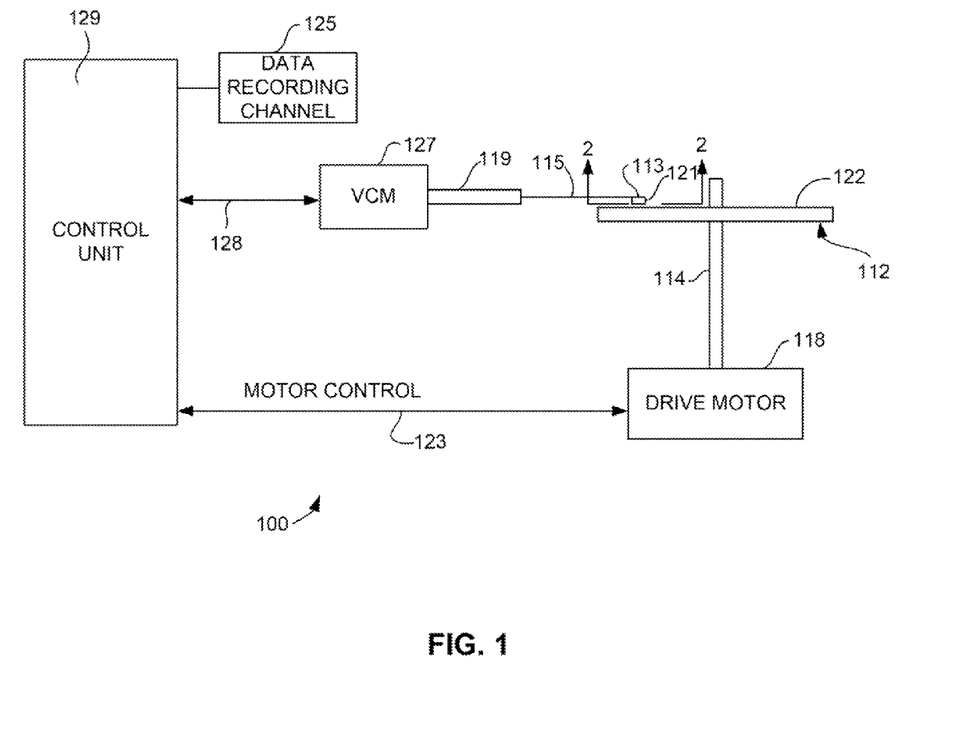
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 can access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 12 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
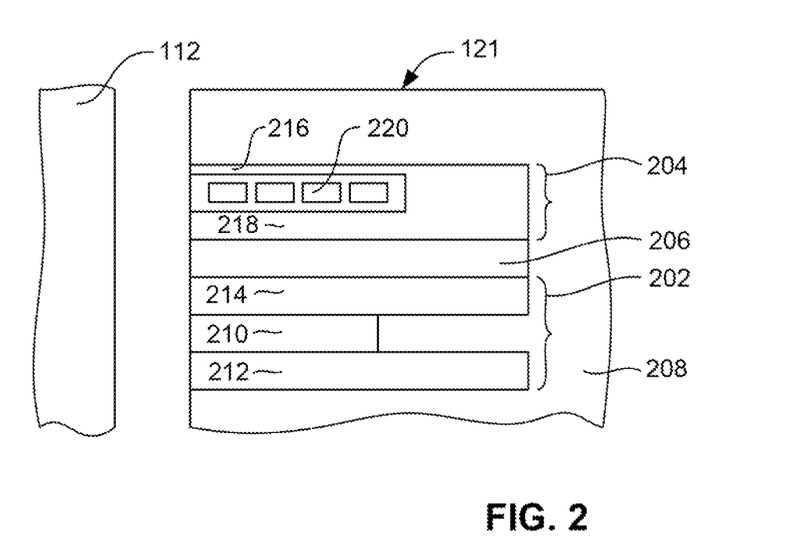
FIG. 2 is a side, cross sectional schematic illustration of a read and write head formed on a slider.

FIG. 2, shows a side, cross-sectional, schematic view of a magnetic head 121 that might formed on the trailing end of a slider 113. The magnetic head 121 includes a magnetic read head 202 and a magnetic write head 204. The read head 202 and magnetic write head 204 can be separated from one another by a non-magnetic, electrically insulating spacer layer 206. The magnetic head 121 can be embedded in an electrically insulating protective layer 208 such as alumina.

The read head 202 includes a spin accumulation sensor 210, sandwiched between first and second magnetic shields 212, 214. The spin accumulation sensor 210 will be described in greater detail herein below. The write head 204 includes a yoke structure that includes a magnetic write pole 216, a magnetic return pole 218 and an electrically conductive coil 220 shown in cross section in FIG. 2. When an electrical current flows through the coil 220, a magnetic flux flows through the poles 216, 218, causing a magnetic write field from the write pole 216 to write a magnetic bit onto the adjacent magnetic medium 112. This recorded magnetic bit can later be read by the read head 202.

Figure 3:
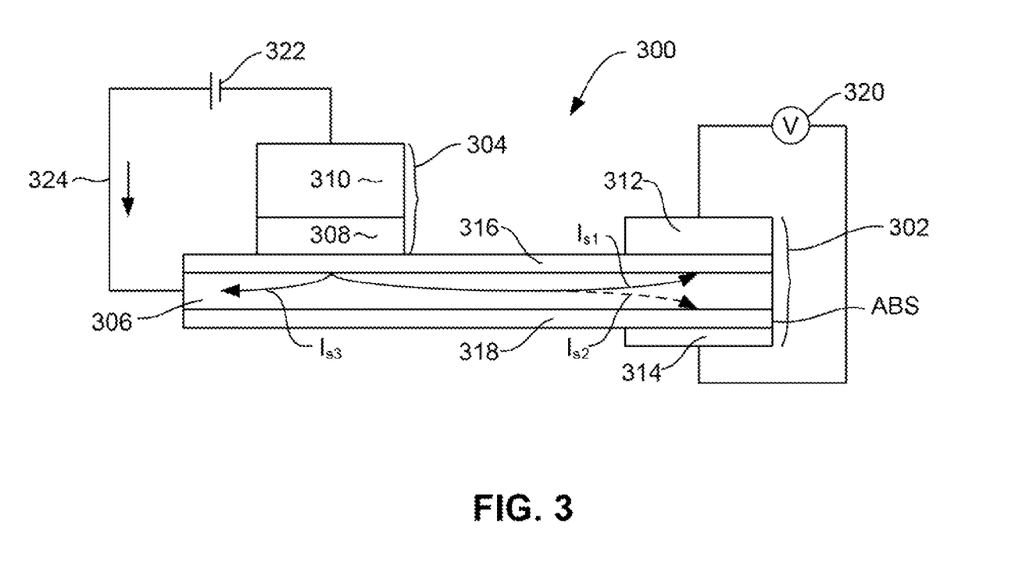
FIG. 3 is a schematic illustration of a spin accumulation sensor according to an embodiment of the invention.

With reference now to FIG. 3 a spin accumulation sensor 300 according to an embodiment of the invention is described. The sensor 300 includes a detector 302 for detecting an output voltage and an injector 304 for injecting electrons of a particular uniform electron spin into a non-magnetic, electrical conductor 306, which accumulates the spin oriented electrons. The non-magnetic electrical conductor 306 can be constructed of a material such as: Cu, Au, Ag, Pt, Al, Pd, Ru, Ir, Rh or a conductive compound having as a main component: GaAs, Si, TiN, TiO, or $ReO_3$. The detector 302 is located adjacent to or at the air bearing surface (ABS). The injector 304 is preferably located away from the ABS, as shown, and the non-magnetic, electrically conductive layer 306 extends from the detector 302 to the injector 304.

The spin injector 304 includes an electrically conductive, magnetic layer 308 that has a magnetization that is pinned in a direction (preferably perpendicular to the air bearing surface ABS). Pinning of the magnetization of the pinned magnetic layer 308 can be achieved by exchange coupling with a layer of anti-ferromagnetic material such as IrMn or PtMn 310. However, the pinning of the magnetization of the magnetic layer 308 can be achieved by other means as well, such as by forming the magnetic layer 308 as a laminated ferri structure or by some other suitable method.

The detector 302 includes a first magnetic, electrically conductive layer 312 and a second magnetic, electrically conductive layer 314. The magnetic, electrically conductive layers 312, 314 both have magnetizations that are free to move in response to a magnetic field, and can therefore be referred to herein as first and second magnetic free layers 312, 314. The first and second magnetic free layers 312, 314 preferably have their magnetizations biased in a direction parallel with the ABS, but still able to move in response to a magnetic field. In addition, the magnetic free layers 312, 314 are constructed of such a thickness that they are magnetically anti-parallel coupled, causing the layers 312, 314 to have magnetizations that are opposite to one another (e.g. anti-parallel). The first magnetic free layer 312 is separated from the non-magnetic, conductive layer 306 by a first thin, non-magnetic, electrically insulating barrier layer 316 and the second magnetic free layer 314 is separated from the non-magnetic, electrically conductive layer 306 by a second thin, electrically insulating barrier layer 318.

A voltage detector 320 is connected between the first and second magnetic free layers 312, 314 as indicated schematically in FIG. 3, and can detect a change in voltage (or associated change in electrical resistance) across the first and second magnetic free layers 312, 314, barrier layers 316, 318 and non-magnetic conductor 316. A current source 322 is connected with the injector 304 and the conductor 306 in order to cause an electrical current to flow through the pinned magnetic layer 308 and into the non-magnetic, electrically conductive layer 306. Because the pinned layer 308 has its magnetization pinned as described above, the electrons passing through the pinned layer 308 will have their electron spins polarized based on the magnetic orientation of the pinned layer 308. These spin polarized electrons can the pass through and accumulate in the non-magnetic, electrically conductive layer 306.

The ability of the spin polarized electrons to pass through each of the barrier layers 316, 318 to each of the magnetic free layers 312, 314 will depend upon the relative orientations of the magnetization of each of the magnetic free layers 312, 314. The closer magnetization of the first free layer 312 is to being aligned with the magnetization of the pinned layer 308, the easier it will be for the spin oriented electrons to pass through the barrier layer 316. Similarly, the closer the magnetization of the second free layer 314 is to being aligned with the magnetization of the pinned layer 308, the easier it will be for the spin oriented electrons to pass through the barrier layer 318 to the second free layer 314. It will be recalled that, while the magnetizations of the first and second magnetic free layers 312, 314 are free to move, they are also anti-parallel with one another. Therefore, in the presence of a magnetic field, such as from a magnetic media, the magnetizations of the first and second magnetic layers 312, 314 will move in a scissor like fashion either toward or away from the ABS. Therefore, this movement of the magnetizations of the free layers 312, 314 results in a voltage change that can be detected by the voltage detector 320.

The sensor 300 operates based on the spin accumulation effect, which is the phenomenon of the accumulation of spin-polarized electrons in the non-magnetic, electrically conductive layer 306. The spin-polarized electrons stored in the non-magnetic conductor generate a spin current that does not involve the current in the non-magnetic conductor 306 because diffusion is caused by the density differences between up-spin electrons and down-spin electrons. Therefore, the voltage detected by the voltage detector 320 is caused by the spin accumulation effect. A voltage difference dV is produced in the detector 302 which is dependent upon the relative orientations of the magnetizations of the free magnetic layers 312, 314, relative to the pinned magnetic layer 308. This voltage difference is referred to as the output voltage dV of the spin accumulation element. The measurement method of the output voltage is usually a non-local voltage measurement that does not have a current flow in the voltage detector. Effective ways to increase dV are to lengthen the spin diffusion length $\lambda$ and to decrease the distance between injector 304 and detector 302.

Figure 8:
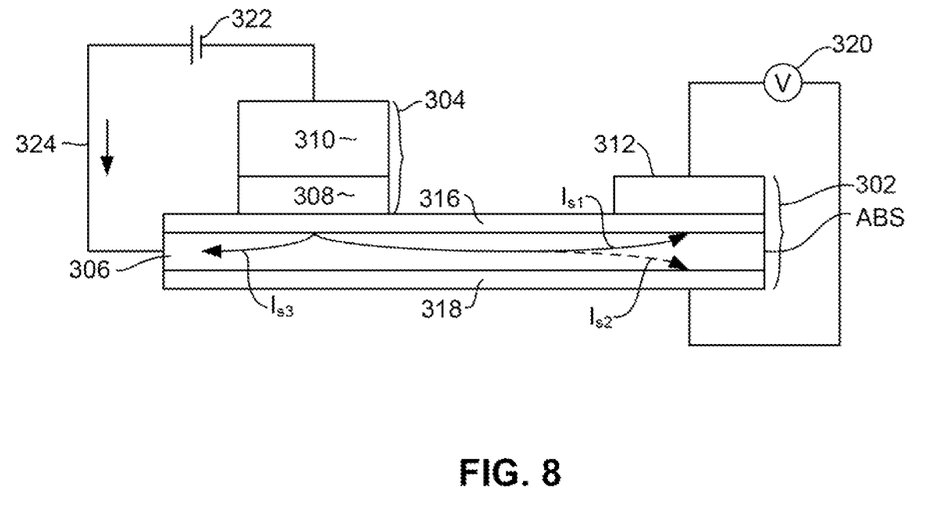
FIG. 8 is a schematic illustration of a spin accumulation sensor not employing the present invention for purposes of comparison.

The output voltage dV of the spin accumulation sensor 300 is proportional to the magnitude of the spin current $I_{s1}$ flowing through the non-magnetic conductor 306 into the detector 302. For purposes of comparison, FIG. 8 shows a spin accumulation sensor 300 that is similar to that described above with reference to FIG. 3, except that it only has one free layer connected with the first barrier layer 316. In FIG. 8, it can be seen that the voltage detector is connected with the layer 318 and with the free-layer 312. It can be appreciated that a portion of the spin current $I_{s1}$ travels to through the free layer 312, whereas a portion of the spin current $I_{s2}$ travels to the bottom lead 302, which makes connection with the voltage sensor possible. Only the current $I_{s1}$ contributes to the signal. The portion $I_{s2}$ does not contribute to signal, and therefore, reduces the output signal of the sensor 300. If the total spin current ejected from the ejector into the non-magnetic conductor 306 is denoted as $I_{s0}$, the amount of wasted spin current lost to the bottom lead 802 is found as $I_{s2}=1/(1+t_N/hMR)I_{s0} \exp(-d/\lambda)$, where $t_N$ is the thickness of the non-magnetic conductor 306, hMR is the height of the spin accumulation sensor 300, d is the distance between the free layer 316 and the pinned layer 308, and $\lambda$ is the spin diffusion length of the material making up the non-magnetic conductor.

When $t_N$ becomes small, the spin resistance of the contact between the non-magnetic conductor 306 and the lead 802 opposite the free layer 312 becomes relatively smaller than that between the free layer 312 and the non-magnetic conductor 306. As a result the amount of spin current $I_{s2}$ lost to the bottom contact 802 increases and sensor output decreases.

The present invention as described above overcomes this problem by including the second free layer 314. In the embodiment shown in FIG. 3, both spin currents $I_{s1}$ and $I_{s2}$ contribute to the output of the sensor 300. The efficiency and effectiveness of the sensor are thereby greatly enhanced by the presence of both free layers 312, 314 in the detector 302.

In the magnetic sensor 300, the total output voltage becomes $V_1+V_2$, where $V_1$ is the output voltage generated by the first free layer 312 and $V_2$ is the output voltage generated by the second free layer 314, and where a potential difference is obtained between the first magnetic first and second magnetic free layers 312, 314 which (as discussed above) have opposite polarities. Magnetic noise in the resulting signal decreases because the anisotropic magnetic field is increased by the magnetic coupling of the first and second free layers 312, 314.

With continued reference to FIG. 3, the magnetic pinned layer 308 and first and second magnetic free layers 312, 314 can be constructed of an alloy or a compound containing Co, Ni, Fe, Mn or at least one of these elements as the main component. The magnetic layers 308, 312, 314 can also be constructed of an oxide having a structure composed of $XY_2O_4$ (where X is at least one of Fe, Co, and Zn; Y is one of Fe, Co, Ni, Mn, and Zn) represented by the half metal $Fe_3O_4$, a compound of at least one component of Fe, Co, Ni, Cr, and Mn which is the transition metal doped in $CrO_2$, CrAs, CrSb, or ZnO; a compound of Mn doped in GaN; or a Heusler alloy having C2D×E×F form (where the material C includes at least one of Co, Cu, and Ni; D and E can are at least one of Mn, Fe and Cr; and F is at least one of Al, Sb, Ge, Si, Ga, and Sn). Examples of such materials include Co2MnGe, Co2MnSb, Co2CrO, 6FeO, and 6Fe4Al.

The thin, non-magnetic, electrical insulating barrier layers 316, 318 can be either a single film or a laminated film composed of materials including at least one of MgO, Al2O3, ZnO, AlN, SiO2, HfO2, Zr2O3, Cr2O3, TiO2 and SrTiO3. The AFM layer 310 can be IrMn, PtMn, RhMn, etc.

Figure 4:
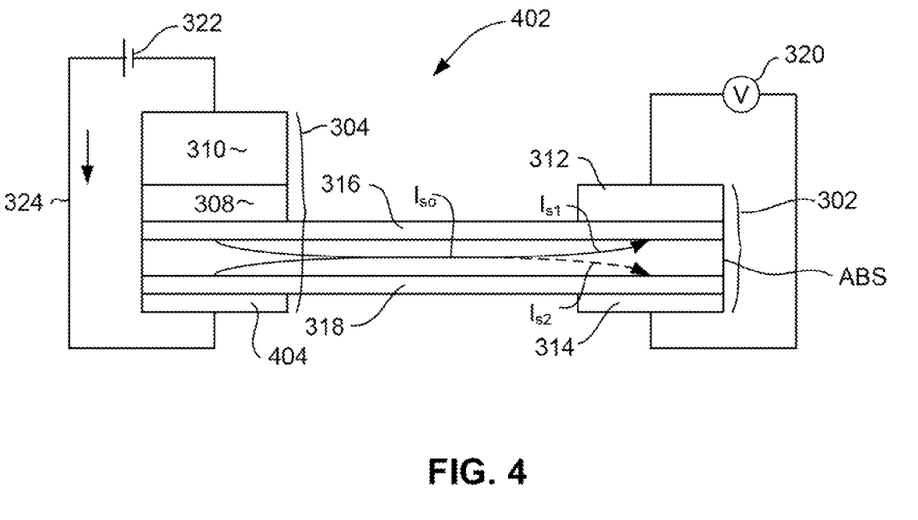
FIG. 4 is a schematic illustration of a spin accumulation sensor according to an alternate embodiment of the invention.

FIG. 4 illustrates another embodiment of the invention, which further increases sensor output. With reference back to FIG. 3, it can be seen that a portion of the spin current $I_{s3}$ flows back to the contact 324 that is connected with the current source 322. FIG. 4 shows a spin accumulation 402 that reduces this lost spin current $I_{s3}$, further increasing the efficiency of the sensor 402. To this end, the sensor 402 includes a spin reflector layer 404 opposite the injector 304 across the non-magnetic conductor 306 and layers 318, 316. The electrical current source is then connected between the injector 304 and the spin reflector layer 404 (rather than directly to the non-magnetic conductor 306). The spin reflector layer 404 is a ferromagnetic material and has a thickness such that its magnetization is anti-parallel with that of the pinned layer 308 through exchange coupling with the pinned layer 308.

As with the free layers 312, 314 and pinned layer 308, the layer 404 can be constructed of an alloy or a compound containing Co, Ni, Fe, Mn or at least one of these elements as the main component. The magnetic layer 404 can also be constructed of an oxide having a structure composed of $XY_2O_4$ (where X is at least one of Fe, Co, and Zn; Y is one of Fe, Co, Ni, Mn, and Zn) represented by the half metal $Fe_3O_4$, a compound of at least one component of Fe, Co, Ni, Cr, and Mn which is the transition metal doped in $CrO_2$, CrAs, CrSb, or ZnO; a compound of Mn doped in GaN; or a Heusler alloy having C2D×E×F form (where the material C includes at least one of Co, Cu, and Ni; D and E can are at least one of Mn, Fe and Cr; and F is at least one of Al, Sb, Ge, Si, Ga, and Sn). Examples of such materials include Co2MnGe, Co2MnSb, Co2CrO, 6FeO, and 6Fe4Al.

The injection of spin current is produced from the flow of electrical current from the spin reflector 404 to the antiferromagnetic layer 310. Because the magnetization of the spin reflector layer 404 and the pinned magnetic layer 308 are anti-parallel (e.g. in opposite directions), reflections are also added by the spin reflection layer and not only by injection from the magnetic pinned layer 308. For this reason, the layer 404 can be referred to as a second pinned layer and can be considered to be a part of the injector 304, since it contributes to the spin current $I_{s0}$. Therefore, while the previously described embodiments suffered from the loss of spin current $I_{s3}$ at the end opposite the detector 302, this embodiment not only prevents this loss of spin current, but actually adds additional spin current, contributed by the layer 404.

Figure 5:
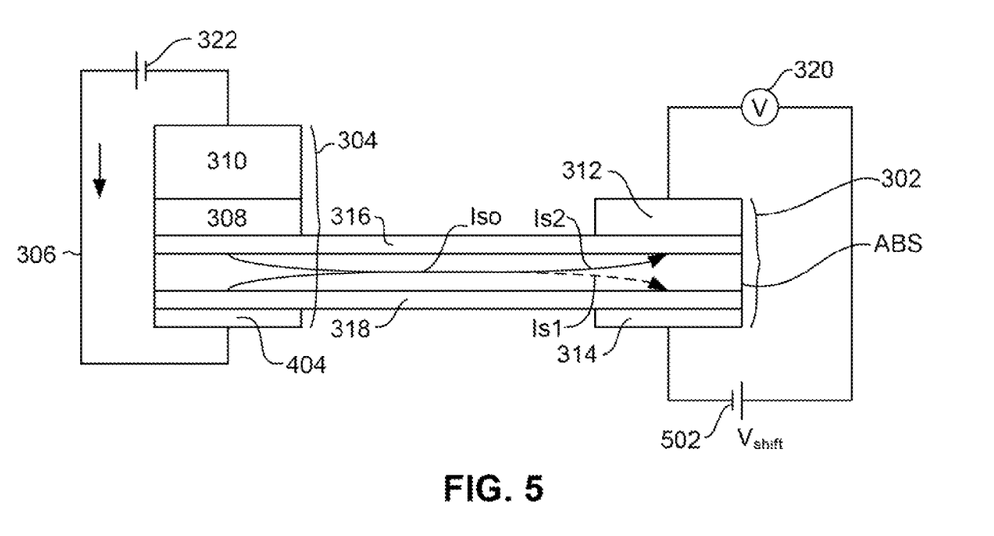
FIG. 5 is a schematic illustration of a spin accumulation sensor according to another embodiment of the invention.
Figure 6:
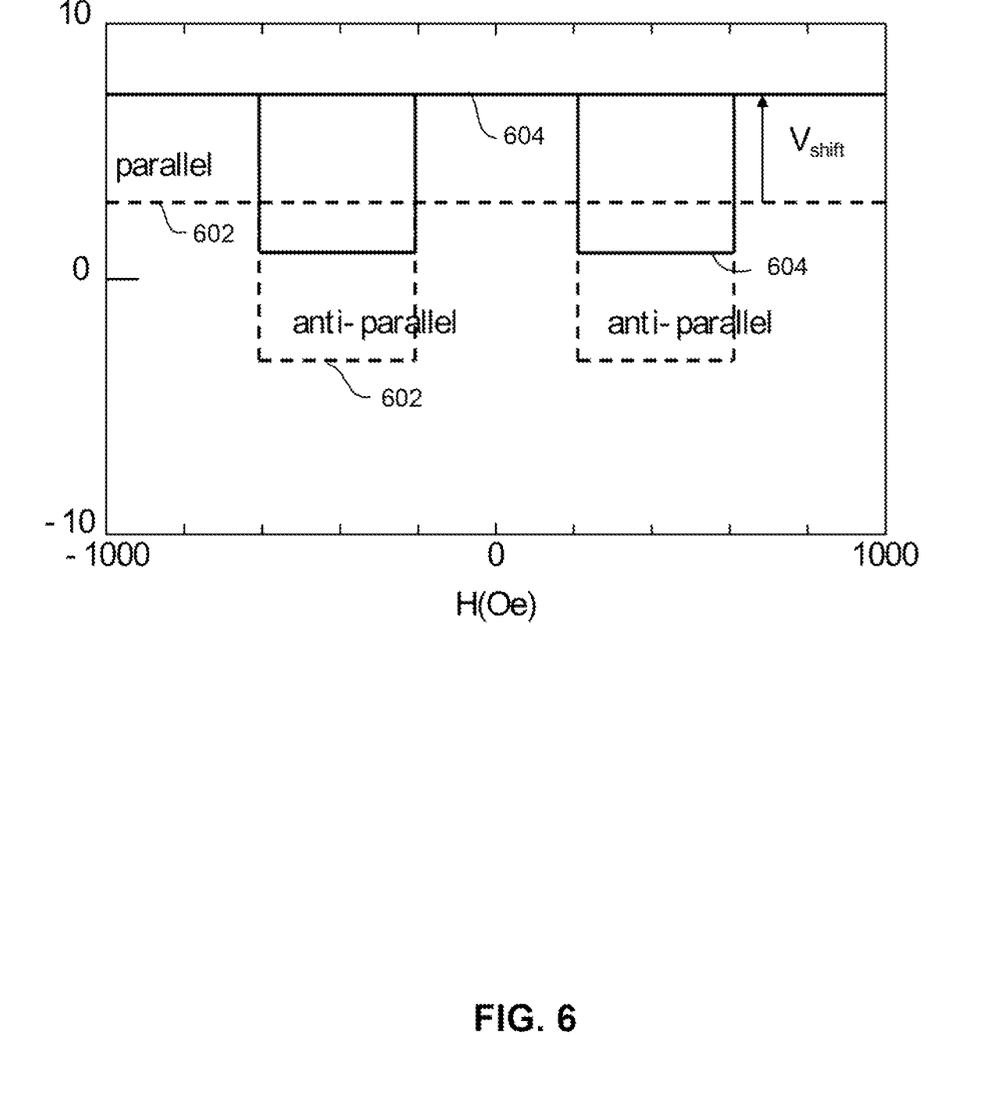
FIG. 6 is a graph showing sensor output voltage with respect to magnetic field strength.

With reference now to FIG. 5, another embodiment of the invention is described. FIG. 5 shows a spin accumulation sensor 500 that is similar to that described above with reference to FIG. 4, except that the sensor 500 includes a second current source 502 connected with the detector 302, in series with the voltage detector 320, for applying a current through the detector 302. The effect of having such a current source 502 in the detector circuitry can be understood with reference to the graph of FIG. 6. In FIG. 6, the dashed line denoted as 602 indicates the signal for a spin accumulation sensor that does not have the additional current source 502. It can be seen that the signal form the dashed line alternates between a positive voltage signal and a negative voltage signal, depending upon whether the magnetizations of the free magnetic layers 312, 314 are more in line with the magnetization of the magnetic layers 308, 404 or are aligned more anti-parallel to the layers 308, 404 (e.g. depending upon whether a magnetic field is being sensed into or out of the ABS. However, in FIG. 6, the solid line 604 indicates a signal from a spin accumulation sensor having an additional current source 502 in the detector circuitry as shown in FIG. 5. The presence of the current source shifts the signal so that the signal is not negative (or stays on the same side of the "0" line in the vertical plane). The output voltage can be shifted by the current flowing in the detector 302 and adjusted to the appropriate output voltage waveform. This shifting of the signal can be beneficial for certain signal processing applications in a magnetic data recording system.

Figure 7:
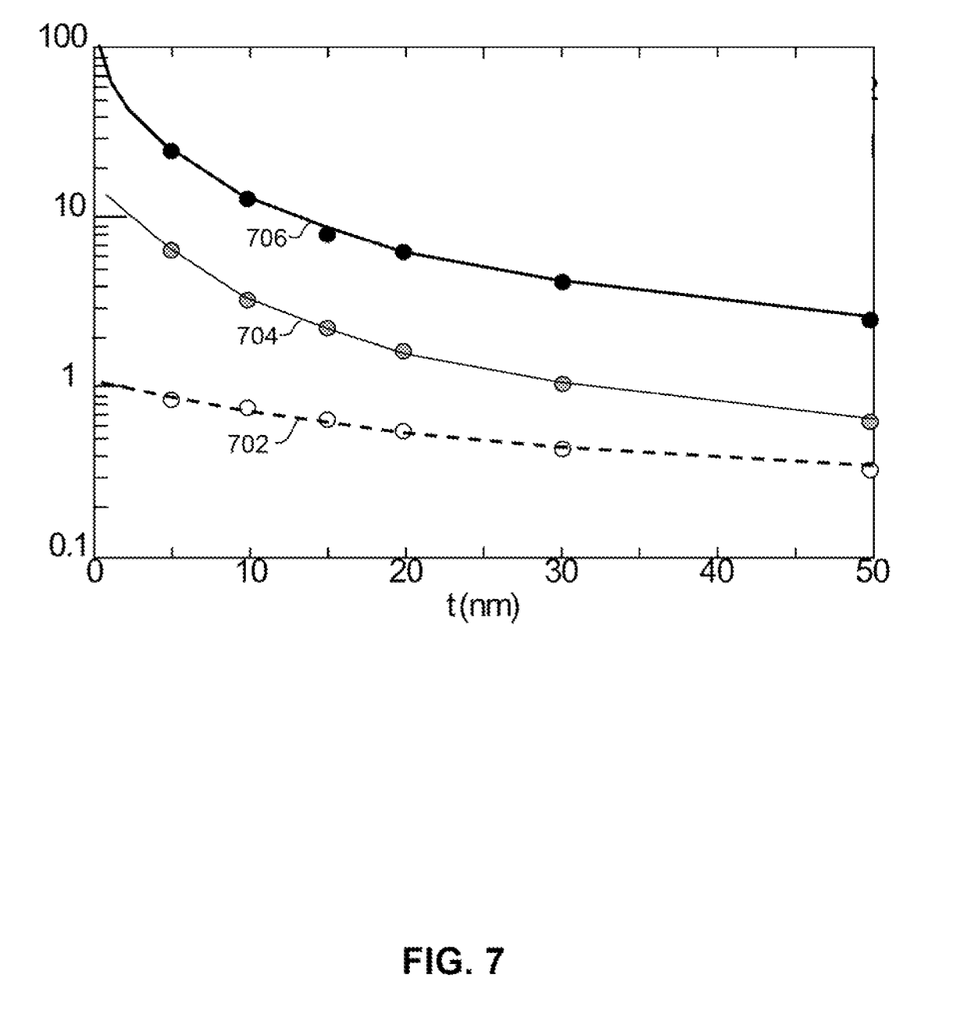
FIG. 7 is a graph showing the relationship between output voltage and thickness of a non-magnetic conductor layer in a magnetic spin accumulation sensor.

FIG. 7 shows the relationship of the output voltage with respect to the thickness of the non-magnetic conductor 306 for various embodiments. Line 702 represents the output voltage for a sensor as described above with reference to FIG. 8 (e.g. one having no second free layer and no second pinned layer). The line 704 represents the output voltage for a sensor as described above with reference to FIG. 3 (e.g. having a second magnetic free layer 314, but having no second pinned layer). The line 606 represents the output voltage for a sensor as described above with reference to FIG. 4 (e.g. having a second magnetic free layer 314 and having a second pinned layer 404.

For the sensor described with reference to FIG. 8, the output voltage becomes:

$\Delta V$ is directly proportional to $1/(t_N + hMR)$, where $tN$ is the thickness of the non-magnetic conductor 306 and $hMR$ is the height of the sensor 300, 402.

When the non-magnetic conductor 306 becomes a thin film the output voltage increases. However, because the current diverging from the spin current becomes large, in a region having a thinner non-magnetic conductor 306 than the element height, the effect of the increase in the out-put voltage caused by the thinner film diminishes. By contrast, in the embodiments described with reference to FIGS. 3 and 4, the output voltage is described by the following equation, because the current diverging from the spin current is suppressed by the spin reflection layer. In that case the output voltage is described as:

$\Delta V$ is directly proportional to $1/t_N$.

Therefore, even when the non-magnetic conductor 306 is thinner than the element height, the output voltage can be increased by making the non-magnetic conductor 306 thinner.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetic sensor, comprising:
a detector structure located near an air bearing surface, the detector structure including first and second magnetic free layers that are magnetically anti-parallel coupled with one another;
a spin injection structure located away from the air bearing surface;
a non-magnetic, electrically conductive layer extending from the detector structure to the spin injection structure; and
a non-magnetic, electrically insulating barrier layer located between the non-magnetic electrically conductive layer and each of the first and second magnetic free layers;
wherein the non-magnetic electrically conductive layer passes between the first and second magnetic free layer structures.

2. The magnetic sensor as in claim 1 further comprising a voltage detector connected with each of the first and second magnetic free layers.

3. The magnetic sensor as in claim 1 wherein the spin injection structure includes a magnetic pinned layer.

4. The magnetic sensor as in claim 1 wherein the spin injection structure includes a magnetic pinned layer and a layer of antiferromagnetic material exchange coupled with the layer of antiferromagnetic material.

5. The magnetic sensor as in claim 1 wherein the spin injection structure comprises a magnetic pinned layer and an electrical current source connected between the magnetic pinned layer and the non-magnetic, electrically conductive layer.

6. The magnetic sensor as in claim 1 further comprising a current source connected in series with the voltage detector between the first and second magnetic free layers.

7. The magnetic sensor as in claim 1 wherein each of the magnetic free layers comprises an alloy or a compound containing Co, Ni, Fe, Mn; an oxide containing $XY_2O_4$ (where X is at least one of Fe, Co, and Zn; Y is one of Fe, Co, Ni, Mn, and Zn); or a Heusler alloy.

8. A magnetic sensor as in claim 1 wherein the non-magnetic, electrically insulating barrier layers comprise one or more of MgO, Al2O3, ZnO, AlN, SiO2, HfO2, Zr2O3, Cr2O3, TiO2 and SrTiO3.

9. The magnetic sensor as in claim 1 wherein the non-magnetic, electrically conductive layer comprises one or more of Cu, Au, Ag, Pt, Al, Pd, Ru, Ir and Rh or a conductive compound having as a main component: GaAs, Si, TiN, TiO, or $ReO_3$.

10. A magnetic sensor, comprising:
a detector structure located near an air bearing surface, the detector structure including first and second magnetic free layers;
a spin injection structure located away from the air bearing surface and comprising first and second magnetic layers the first magnetic layer being magnetically pinned and the second magnetic layer being antiparallel coupled with the first magnetic layer; and
a non-magnetic, electrically conductive layer extending from the detector structure to the spin injection structure; wherein the non-magnetic electrically conductive layer passes between the first and second magnetic free layer structures and between the first and second magnetic layers of the spin injection structure.

11. The magnetic sensor as in claim 10, further comprising:
a voltage detector connected with each of the first and second magnetic free layers; and
a current source connected with each of the first and second magnetic layers of the spin injector structure.

12. The magnetic sensor as in claim 10 further comprising a non-magnetic, electrically insulating barrier layer being located between the non-magnetic electrically conductive layer and each of the first and second magnetic free layers; and also being located between the non-magnetic, electrically conductive layer and each of the first and second magnetic layers of the spin injection structure.

13. A magnetic sensor as in claim 12 wherein the non-magnetic, electrically insulating barrier layers comprise one or more of MgO, Al2O3, ZnO, AlN, SiO2, HfO2, Zr2O3, Cr2O3, TiO2 and SrTiO3.

14. The magnetic sensor as in claim 10 further comprising a layer of antiferromagnetic material exchange coupled with the first magnetic layer of the spin injection structure.

15. The magnetic sensor as in claim 14 wherein the antiferromagnetic material comprises one or more of IrMn, PtMn and RhMn.

16. The magnetic sensor as in claim 10 further comprising a current source connected in series with the voltage detector between the first and second magnetic free layers.

17. The magnetic sensor as in claim 10 wherein each of the magnetic free layers and each of the first and second magnetic layers of the spin injection structure comprises an alloy or a compound containing Co, Ni, Fe, Mn; an oxide containing $XY_2O_4$ (where X is at least one of Fe, Co, and Zn; Y is one of Fe, Co, Ni, Mn, and Zn); or a Heusler alloy.

18. The magnetic sensor as in claim 10 wherein the non-magnetic, electrically conductive layer comprises one or more of Cu, Au, Ag, Pt, Al, Pd, Ru, Ir and Rh or a conductive compound having as a main component: GaAs, Si, TiN, TiO, or $ReO_3$.

* * * * *